(12) United States Patent
Suzuki

(10) Patent No.: US 6,850,459 B2
(45) Date of Patent: Feb. 1, 2005

(54) SYNCHRONOUS SEMICONDUCTOR MEMORY DEVICE ALLOWING ADJUSTMENT OF DATA OUTPUT TIMING

(75) Inventor: Takanobu Suzuki, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/627,640

(22) Filed: Jul. 28, 2003

(65) Prior Publication Data

US 2004/0160833 A1 Aug. 19, 2004

(30) Foreign Application Priority Data

Feb. 17, 2003 (JP) .......................... 2003-038709

(51) Int. Cl.$^7$ .............................. G11C 8/00; G11C 7/00
(52) U.S. Cl. .................................. 365/233; 365/189.04
(58) Field of Search .......................... 365/233, 189.04, 365/194

(56) References Cited

U.S. PATENT DOCUMENTS

2003/0217303 A1 * 11/2003 Chua-Eoan et al. ......... 713/600

FOREIGN PATENT DOCUMENTS

JP 11-86547 3/1999

* cited by examiner

*Primary Examiner*—Thong Q. Le
(74) *Attorney, Agent, or Firm*—McDermott Will & Emery LLP

(57) ABSTRACT

In an input/output buffer, delay control units are provided for transmitting control signals for outputting data from a data output circuit, with different propagation time in accordance with the order of data to be output, in a burst reading of data from a memory cell array.

6 Claims, 7 Drawing Sheets

SYNCHRONOUS SEMICONDUCTOR MEMORY DEVICE ALLOWING ADJUSTMENT OF DATA OUTPUT TIMING

BACKGROUND OF THE INVENTION

1. Field of the Invention

The present invention relates to a synchronous semiconductor memory device and, more specifically, to a synchronous semiconductor memory device that can eliminate difference of data output timing in a burst read operation.

2. Description of the Background Art

In order to meet the demand for higher frequency operation of synchronous semiconductor memory devices, a double data rate SDRAM (Double Data Rate Synchronous Dynamic Random Access Memory: hereinafter referred to as a DDR-SDRAM) has been developed and come to be practically used, in which data is communicated with the outside in synchronization with both rising and falling edges of an external clock signal.

As compared with an SDRAM that operates in synchronization with either the rising edge or the falling edge of the external clock signal, the DDR-SDRAM is capable of reading data and writing data approximately at the double rate.

It is noted, however, that the DDR-SRAM operates at a very high speed, and therefore, it is necessary to adjust data output timing with very high precision particularly in order to have the value of tLZ defining a timing period between the external clock signal and the first output data and the value of tAC defining the timing period between the external clock signal and the second and the following output data within specific tolerable ranges.

In view of the foregoing, a method has been proposed (hereinafter referred to as a conventional art), for example, in Japanese Patent Laying-Open No. 11-86547, for adjusting data output timing in a synchronous semiconductor memory device, though not in a DDR-SDRAM.

Generally, in a burst read operation in a synchronous semiconductor memory device such as a DDR-SDRAM or an SDRAM, the time period until the first data is output corresponds to the time period necessary for the voltage level to change from the precharge level (Vcc/2). In contrast, the time period until the second or the following data is output corresponds to the time period necessary for the voltage level to change form the power supply voltage Vcc or from the ground voltage GND. Therefore, it follows that the first data output timing becomes relatively faster than the second or the following data output timing.

The above described conventional art is for adjusting data output timing in an SDRAM. It does not disclose, however, any measure to eliminate the difference between the first data output timing and the second or the following data output timing in a burst read operation.

In a burst read operation in a synchronous semiconductor memory device, if all the data output timings were the same, prescribed set-up time and prescribed hold time for the clock signal to take data would be constant.

Therefore, even when there is a variation in electrical characteristics of circuits for externally outputting data (hereinafter also referred to as data output circuits) provided in mass-produced synchronous semiconductor memory devices and the set-up time and the hold time come to have some error as a result, it is highly possible that a data reading apparatus can read the data output from the synchronous semiconductor devices.

When there is a variation in electrical characteristics of the data output circuits provided in mass-produced synchronous semiconductor memory devices with the data output timing being different, it would be more difficult to ensure the prescribed set-up time and the prescribed hold time to properly receive data signals. Therefore, there would be a higher possibility of failure of proper data reading by the data reading apparatus. Conventionally, such product has been in many cases regarded as a defective device, resulting in lower production yield.

SUMMARY OF THE INVENTION

An object of the present invention is to provide a synchronous semiconductor memory device that enables improved production yield, by eliminating difference of data output timing in a burst read.

In summary, the present invention provides a synchronous semiconductor memory device operating in synchronization with a clock signal, including a memory cell array having a plurality of memory cells arranged therein, an output control circuit burst-reading a plurality of read data from the memory cell array and sequentially generating, in synchronization with the clock signal, a plurality of read instructions indicating levels of the plurality of read data respectively, a data output circuit outputting data in response to each of the sequentially generated the plurality of read instructions, a transmission control unit provided between the output control circuit and the data output circuit and transmitting each of the plurality of read instructions generated by the output control circuit to the data output circuit, and a signal propagation control circuit determining whether each of the plurality of read instructions sequentially generated by the output control circuit corresponds to a first one or a second or following one of the plurality of read data. The transmission control unit transmits a read instruction corresponding to the first one of the plurality of read data to the data output circuit with a first transmission time and transmits a read instruction corresponding to the second and the following one of said plurality of read data to the data output circuit with a second transmission time being different from the first transmission time, dependent on the result of determination by the signal propagation control circuit.

Therefore, a main advantage of the present invention is that, in a synchronous semiconductor memory device, the time period for the read instruction corresponding to the second and the following data to be transmitted to the data output circuit and the time period for the read instruction corresponding to the first read data to be transmitted to the data output circuit in a burst read can be adjusted, and therefore, the difference of the data output timing at the first read data output from the state precharged at the intermediate voltage and the second or the following read data output can be eliminated.

As a result, even when there is a variation in electrical characteristics of data output circuits provided in mass-produced synchronous semiconductor memory devices and the set-up time and the hold time come to have some error, possibility of correct data reading by an externally provided data reading apparatus becomes higher. Therefore, the number of products that would have been regarded defective decreases, and production yield can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
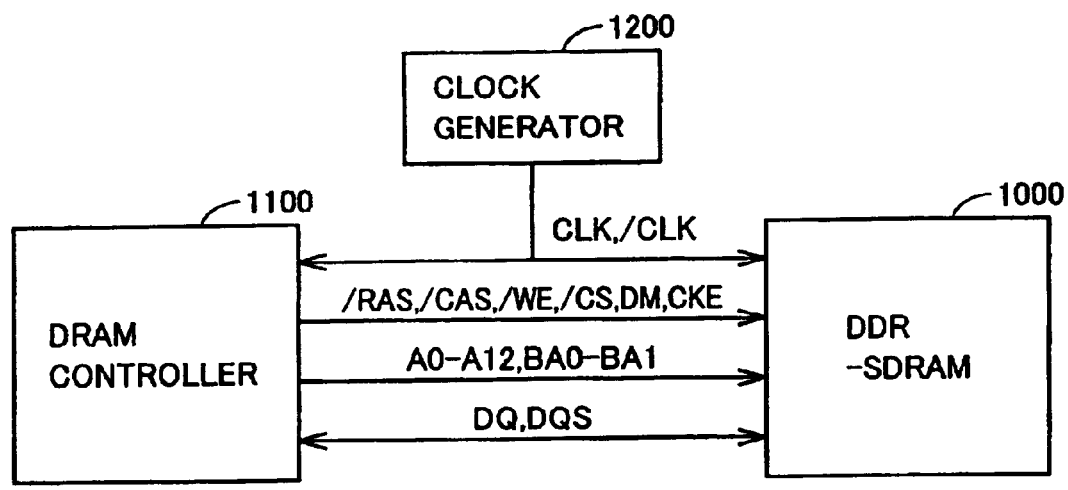
FIG. 1 is a block diagram representing a system overview of a synchronous semiconductor memory device.

Embodiments of the present invention will be described in the following with reference to the figures. In the figures, the same or corresponding portions will be denoted by the same reference characters.

First Embodiment

Referring to FIG. 1, the system of the synchronous semiconductor memory device includes a synchronous semiconductor memory device 1000, a DRAM controller 1100 and a clock generator 1200. A DDR-SDRAM is shown as an example of synchronous semiconductor memory device 1000.

In the following description, a signal following the sign "/" represents an inversion of the same signal without the sign "/". Further, binary states of a high voltage (for example, power supply voltage Vcc) and a low voltage (for example, ground voltage GND) of the signals and data will also be referred to as H level and L level, respectively.

DRAM controller 1100 and synchronous semiconductor memory device 1000 operate in response to external clock signals CLK and /CLK from clock generator 1200.

DRAM controller 1100 transmits control signals /RAS, /CAS, /WE, /CS, DM and a clock enable signal CKE, address signals A0 to A12 and bank address signals BA0 and BA1 to synchronous semiconductor memory device 1000. Further, DRAM controller 1100 transmits and receives a data strobe signal DQS as a reference of data communication timing to/from synchronous semiconductor memory device 1000, thereby enabling data reading from synchronous semiconductor memory 1000 and data writing to synchronous semiconductor memory device 1000.

When there is a burst read request from DRAM controller 1100, synchronous semiconductor memory device 1000 transmits continuous data DQ to DRAM controller 1100. DRAM controller 1100 can receive data properly when a prescribed set-up time and a prescribed hold time for the clock signal CLK are secured. When a burst read operation is performed in a DDR-SDRAM, however, the output timing of the first data becomes faster than the output timing of the second or the following data.

Therefore, the value tLZ defining a timing period between an external clock signal and the first data output timing becomes smaller than the value tAC defining the timing period between the external clock signal and the second and the following data output timing. When the difference between the values tLZ and tAC is large and electrical characteristics of devices in the data output circuits in mass-produced synchronous semiconductor memory devices vary, it would be more difficult to secure the prescribed set-up time and the prescribed hold time to properly receive data signals DQ. Accordingly, there is a higher possibility that DRAM controller 1100 fails to receive data correctly in a burst read.

In view of the foregoing, the configuration of synchronous semiconductor memory device 1000 will be described, which is formed to enable correct data reception by DRAM controller 1100 even when there is some variation in electrical characteristics of devices in the data output circuits, by making tAC and tLZ in a burst read operation equivalent to each other.

Figure 2:
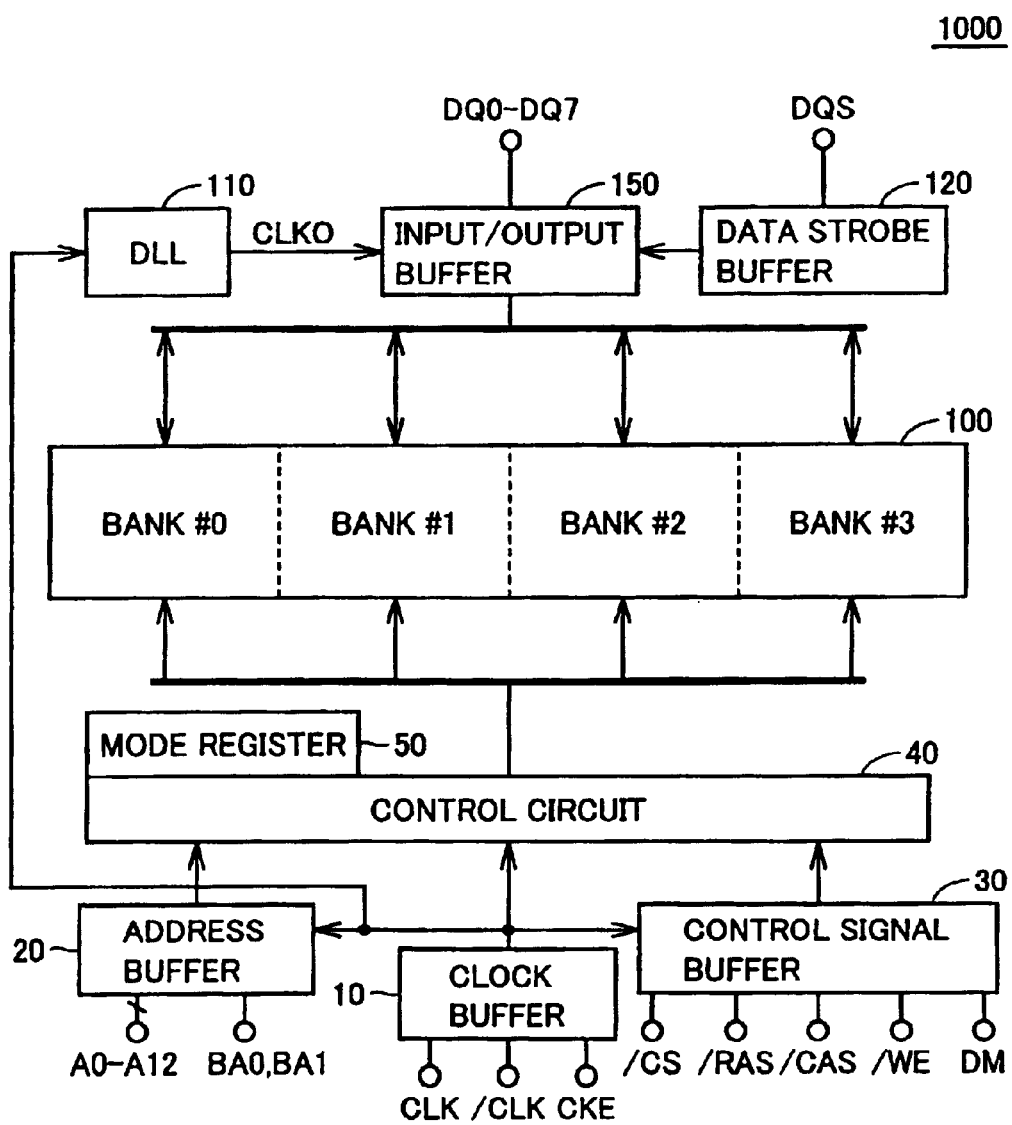
FIG. 2 is a block diagram representing a schematic configuration of the synchronous semiconductor memory device.

Referring to FIG. 2, synchronous semiconductor memory device 1000 includes a clock buffer 10 receiving external clock signals CLK and /CLK and a clock enable signal CKE, an address buffer 20 receiving address signals A0 to A12 and bank address signals BA0 and BA1, and a control signal buffer 30 receiving control signals /CS, /RAS, /CAS, /WE and DM. Address buffer 20 and control signal buffer 30 take the address signals and the control signals listed above, in synchronization with an output of clock buffer 10.

Synchronous semiconductor memory device 1000 further includes a data strobe buffer 120 inputting/outputting a data strobe signal DQS as a reference of data communication timing, a delay locked loop (DLL) circuit 110 generating an internal clock signal in response to an output of clock buffer 10, and an input buffer 150 enabling data communication between memory cell array 100 and the outside.

Because of signal propagation delay in the synchronous semiconductor memory device, when input/output buffer 150 outputs data in response to the external clock signal CLK, data output timing inherently delays from the external clock signal CLK. In order to prevent this, DLL circuit 110 generates and supplies to input/output buffer 150 an internal clock signal CLKO based on the external clock signals CLK and /CLK, which has its phase advanced by a time period corresponding to the internal signal propagation delay.

Synchronous semiconductor memory device 1000 further includes a control circuit 40 receiving outputs from address buffer 20 and control signal buffer 30 in synchronization with the output of clock buffer 10, a memory array 100 controlled by control circuit 40 and storing data, and a mode register 50.

Memory array 100 is divided into four banks #0 to #3, in each of which a plurality of memory cells are arranged.

Input/output buffer 150 externally outputs data of one selected memory cell among a plurality of memory cells in banks #0 to #3 of memory array 100 selected in accordance with the bank address signals BA0 and BA1, in synchronization with the internal clock signal CLKO from DLL circuit 110. Further, input/output buffer 150 takes data input from the outside, in synchronization with the data strobe signal DQS applied from data strobe buffer 120.

Mode register 50 holds an operation mode designated by an address signal being applied at that time, in accordance with a mode register set command given by a combination of control signals from control circuit 40.

Next, the data output circuit will be described, which has a configuration that allows highly precise adjustment of data output timings in a burst read, provided in input/output buffer 150.

In synchronous semiconductor memory device 1000, a data output control circuit 200 is provided inside input/output buffer 150.

Figure 3:
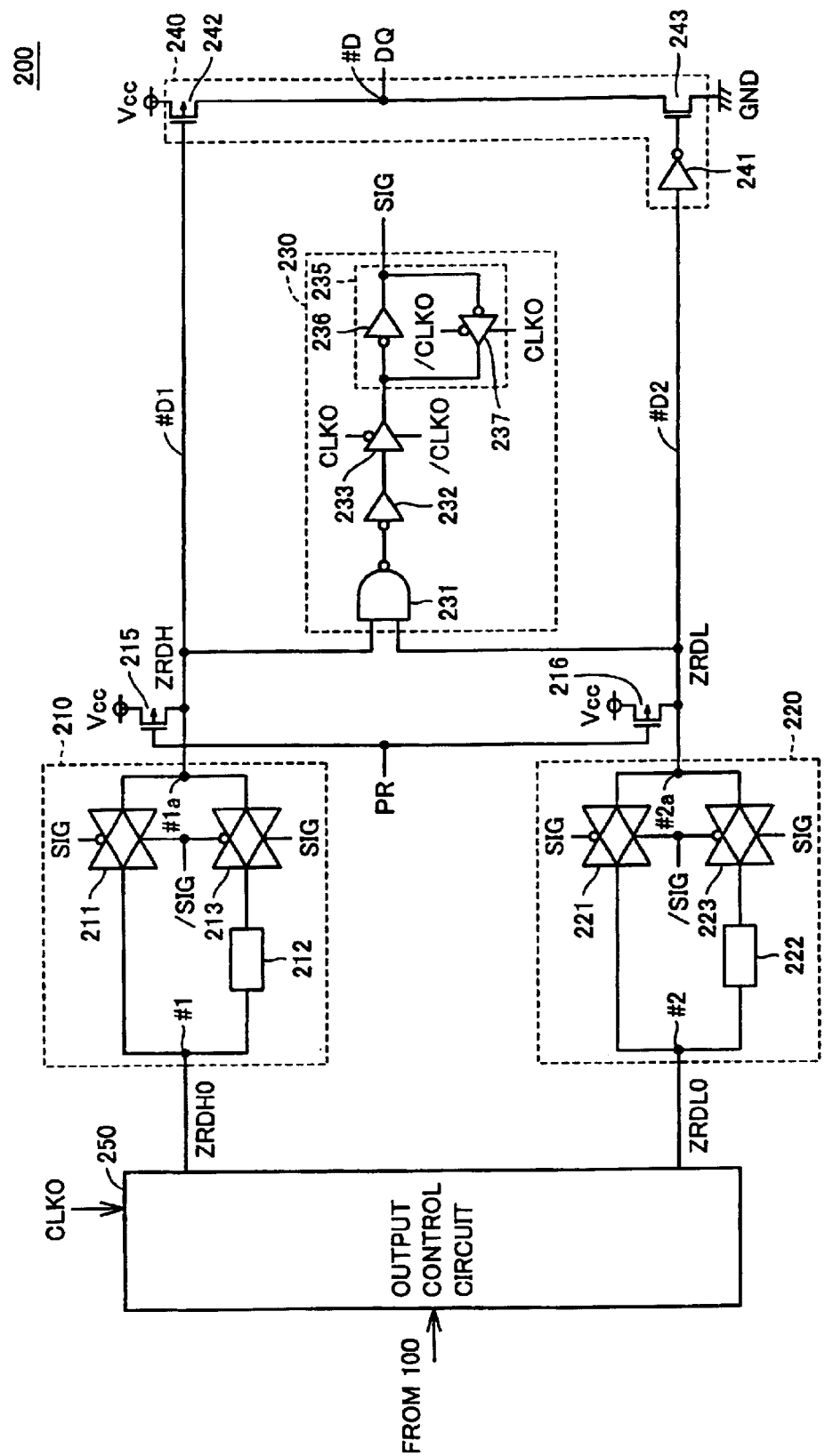
FIG. 3 is a circuit diagram representing a configuration of a data output control circuit provided inside an input/output buffer of the synchronous semiconductor memory device.

Referring to FIG. 3, data output control circuit 200 includes an output control circuit 250 operating in synchronization with internal clock signal CLKO when data is to be output from memory cell array 100, delay control units 210 and 220, a signal propagation control circuit 230, a data output circuit 240, and data lines #D1 and #D2.

Output control circuit 250 outputs, based on the level of the read data from memory cell array 100, control signals ZRDH0 and ZRDL0, for setting the level of data signal DQ output from data output circuit 240. When data signal DQ is to be output from data output circuit 240, control signals ZRDH0 and ZRDL0 are set to mutually complementary levels. When data signal DQ is not to be output from data output circuit 240, control signals ZRDH0 and ZRDL0 are both set to the H level, in order to have the output of data output circuit 240 at the high-impedance state.

Though details will be described later, delay control unit 210 outputs the control signal ZRDH0 with either one of two different propagation time periods, based on the control signal from signal propagation control circuit 230. The signal output from delay control unit 210 will be the control signal ZRDH. The control signal ZRDH is input to data output circuit 240. Similarly, delay control unit 220 outputs the control signal ZRDL0 with either one of two different propagation time periods, based on the control signal from signal propagation control circuit 230. The signal output from delay control unit 220 will be the control signal ZRDL. The control signal ZRDL is input to data output circuit 240.

Data output circuit 240 includes a P channel MOS transistor 242 and an N channel MOS transistor 243 connected in series between the power supply voltage Vcc and the ground voltage GND, and an inverter 241. To the gate of P channel MOS transistor 242, the control signal ZRDH is input. Inverter 241 outputs a signal that is level-inverted from the control signal ZRDL. To the gate of N channel MOS transistor 243, an output signal of inverter 241 is input.

Therefore, when the control signals ZRDH and ZRDL are set at the H level and L level, respectively, data output circuit 240 outputs data signal DQ of L level, from a node #D. When the control signals ZRDH and ZRDL are set at the L level and H level, respectively, data output circuit 240 outputs data signal DQ of H level, from node #D.

Signal propagation control circuit 230 includes an NAND circuit 231, an inverter 232, a clocked inverter 233 and a latch circuit 235.

NAND circuit 231 outputs a signal as a result of a negative logical product (NAND) operation of control signals ZRDH and ZRDL. Inverter 232 outputs a signal that is a level-inversion of the output signal from NAND circuit 231. Clocked inverter 233 outputs a signal that is a level-inversion of the output signal of inverter 232, in response to the internal clock signal CLKO at the L level and the inverted signal /CLKO.

Latch circuit 235 includes an inverter 236 and a clocked inverter 237. Inverter 236 outputs, as a propagation time control signal SIG, a signal obtained by level-inversion of the output signal of clocked inverter 233. Clocked inverter 237 outputs a signal that is a level-inversion of the output signal of inverter 236, in response to the internal clock signal CLKO at the H level and the inverted signal /CLKO. Therefore, latch circuit 235 has a function of temporally holding a signal of which level is inverted from that of the signal input to inverter 236, when the internal clock signal CLKO at the H level and the internal clock signal /CLKO at the L level are not input to two control terminals of clocked inverter 237.

Delay control unit 210 has a transmission gate 211 between nodes #1 and #1a. Upon receiving propagation time control signal SIG at the L level and propagation time control signal /SIG at the H level as inputs to two control terminals, transmission gate 211 outputs control signal ZRDH0 as the control signal ZRDH.

Delay control unit 210 further has a delay circuit 212 and a transmission gate 213 connected in series between nodes #1 and #1a. Though details will be described later, a plurality of inverters for outputting a signal that is the control signal ZRDH0 with a delay of a prescribed time period are provided in delay circuit 212. Upon receiving propagation time control signal /SIG at the L level and propagation time control signal SIG at the H level as inputs to two control terminals, transmission gate 213 outputs an output signal from delay circuit 212 as the control signal ZRDH.

Thus, delay control unit 210 can change the propagation time period of the control signal ZRDH0 from node #1 to #1a, in accordance with the propagation time control signals SIG and /SIG.

Delay control unit 220 has a transmission gate 221 between nodes #2 and #2a. Transmission gate 221 has the same function as transmission gate 211, and therefore, detailed description will not be repeated.

Delay control unit 220 further has a delay circuit 222 and a transmission gate 223 connected in series between nodes #2 and #2a. Delay circuit 222 has the same configuration as delay circuit 212, and therefore, detailed description will not be repeated. Transmission gate 223 has the same function as transmission gate 213, and therefore, detailed description will not be repeated.

Thus, delay control unit 220 can change the propagation time period of the control signal ZRDL0 from node #2 to #2a, in accordance with the propagation time control signals SIG and /SIG.

Data line #D1 electrically connects node #1a with the gate of P channel MOS transistor 242. Therefore, data line #D1 transmits the control signal ZRDH output from delay control unit 210 to data output circuit 240.

Data line #D2 electrically connects node #2a with inverter 241. Therefore, data line #D2 transmits the control signal ZRDL output from delay control unit 220 to data output circuit 240.

Data output control circuit 200 further includes a P channel MOS transistor 215 provided between the power supply voltage Vcc and data line #D1, and a P channel MOS transistor 216 provided between the power supply voltage Vcc and data line #D2.

To the gates of P channel MOS transistors 215 and 216, a precharge signal PR is input. Therefore, when the precharge signal PR is set at the L level, control signals ZRDH and ZRDL are set to the H level, regardless of the voltage levels of control signals ZRDH0 and ZRDL0. When the precharge signal PR is set at the H level, voltage levels of control signals ZRDH and ZRDL are equal to the voltage levels of control signals ZRDH0 and ZRDL0, respectively.

The internal configuration of delay circuit 212 will be described in the following.

Figure 4:
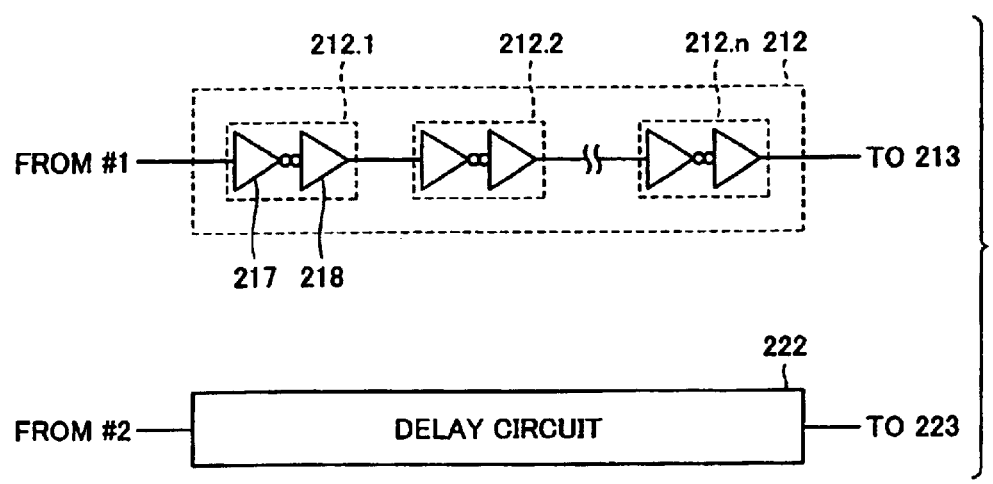
FIG. 4 is a circuit diagram representing an internal configuration of a delay circuit.

Referring to FIG. 4, delay circuit 212 has n delay elements 212.1 to 212.n connected in series. Delay element 212.1 has inverters 217 and 218 connected in series. Each of delay elements 212.2 to 212.*n* has the same configuration as delay element 212.1, and therefore, detailed description will not be repeated. Therefore, delay circuit 212 can make longer the propagation time period of the control signal ZRDH0 from #1 to #1*a* by the number of delay elements.

Delay circuit 222 has the same configuration as delay circuit 212, and therefore, detailed description will not be repeated.

Generally, the time period in which P channel MOS transistor 242 in data output circuit 240 shown in FIG. 3 turns on and data signal DQ is output (hereinafter referred to as H level output time period) and the time period in which N channel MOS transistor 243 turns on and data signal DQ is output (hereinafter referred to as L level output time period) are not always equal, due to variation in mass production or the like. Therefore, by adjusting the number of delay elements in delay circuit 212 or 222, it becomes possible to adjust the H level output time period and the L level output time period of the first data in a burst read operation to be equal to each other, as will be described later.

Figure 5:
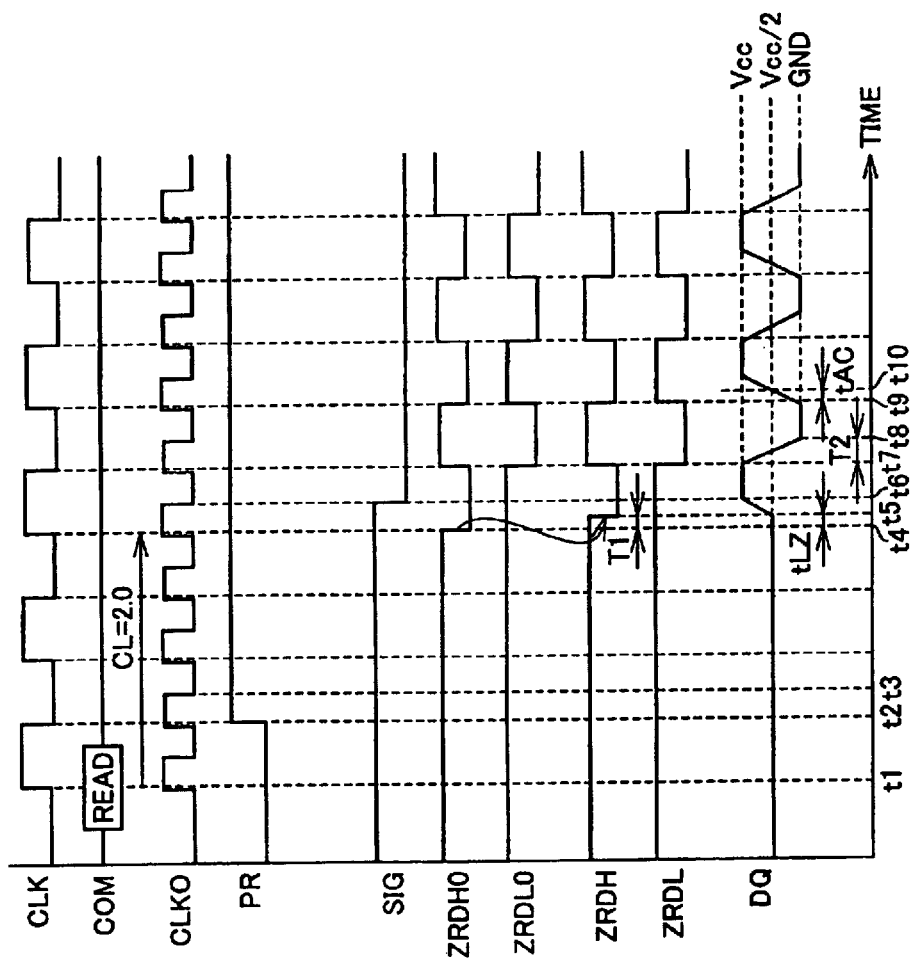
FIG. 5 is a diagram of waveforms illustrating a burst read operation in the synchronous semiconductor memory device.

Referring to FIG. 5, it is assumed that in synchronous semiconductor memory device 1000 in accordance with the present embodiment, the number of necessary clocks CL from issuance of a control command COM to data output is set to "2". Further, it is assumed that levels of data read from memory array 100 in a burst read operation are in the order of "H, L, H, L, H, L". It is also assumed that prescribed delay time set in delay circuits 212 and 222 is set such that tLZ becomes equal to tAC.

In the present embodiment, it is assumed that between synchronous semiconductor memory device 1000 and DRAM controller 1100 shown in FIG. 1, there is provided a circuit for precharging a data line transmitting the data signal DQ output from synchronous semiconductor memory device 1000 to DRAM controller 1100 to ½ Vcc. Further, DQ in FIG. 5 represents the voltage level of the data line. For convenience of description, it is assumed that the time point at which the data signal DQ is output from data output circuit 240 is the same as the time point at which the data signal DQ is output from synchronous semiconductor memory device 1000 and transmitted to the data line.

Next, referring to FIGS. 2, 3 and 5, an operation in a burst read in synchronous semiconductor memory device 1000 will be described. At time point t1, a read command READ, which is one of control commands, is taken by synchronous semiconductor memory device 1000. At time point t1, data lines #D1 and #D2 in data output control circuit 200 have been precharged and the precharge signal PR is set at the L level, and hence the control signals ZRDH and ZRDL are at the H level. Starting from time point t2, data in a plurality of memory cells in a desired bank in memory cell array 100 are input continuously to output control circuit 250. At the same time, precharge is cancelled to output data that have been input to output control circuit 250. Therefore, the precharge signal PR is set to the H level.

The control signals ZRDH and ZRDL maintain the H level even after the cancellation of precharge, and hence the level of the output signal from NAND circuit 231 is set to the L level. Accordingly, the output signal of inverter 232 is set to the H level. At time point t3, when internal clock signal CLKO attains to the L level, clocked inverter 233 outputs a signal of which level is inverted from that of the output signal of inverter 232, and hence the propagation time control signal SIG is set to the H level. Thereafter, even when the internal clock signal CLKO attains to the H level, the propagation time control signal SIG is maintained at the H level by the operation of clocked inverters 233 and 237, until the voltage levels of control signals ZRDH and ZRDL change.

At time point t4, in order to provide the data signal DQ at the H level as the first data in the burst read operation from data output circuit 240, the control signals ZRDH0 at the L level and ZRDL0 at the H level are output from output control circuit 250. At time point t4, the propagation time control signal SIG is set at the H level, and therefore, only transmission gate 213 in delay control unit 210 turns on. Similarly, only transmission gate 223 in delay control unit 220 turns on. Accordingly, as the control signal ZRDH0 is transmitted from node #1 through delay circuit 212 to node #1*a*, it is transmitted with a prescribed delay time (for example, time T1) set by delay circuit 212, from node #1 to node #1*a*. As a result, the control signal ZRDH0 that is at the L level at time point t4 changes to the control signal ZRDH at the L level at a time point t5, that is, after the time period T1 from time point t4.

Similarly, as the control signal ZRDL0 is transmitted from node #2 through delay circuit 222 to node #2*a*, it is transmitted with a prescribed delay time (for example, time T1) set by delay circuit 222, from node #2 to node #2*a*. Therefore, the control signal ZRDL0 that is at the H level at time point t4 changes to the control signal ZRDL at the H level at time point t5, that is, after the time period T1 from time point t4. The time period from time point t4 at which control signals ZRDH0 and ZRDL0 for outputting the first data signal DQ from data output circuit 240 are output from output control circuit 250 until time point t5 at which the voltage level at node #D of data output circuit 240 begins to change is tLZ.

At time point t5, when control signal ZRDH is set to the L level and control signal ZRDL is set to the H level, data output circuit 240 outputs the data signal DQ at the H level at time point t6.

Further, at time t6, when the internal clock signal CLKO attains to the L level, clocked inverter 233 turns on. At time t6, control signal ZRDH is at the L level and ZRDL is at the H level, and hence the level of the output signal of NAND circuit 231 is set to the H level. Therefore, the propagation time control circuit SIG is set to the L level. Specifically, in a burst read operation, when the control signals ZRDH and ZRDL for setting the level of the first data attain to mutually complementary levels and thereafter the internal clock signal CLKO attains to the L level, the propagation time control signal SIG is maintained at the L level, because of the operation of signal propagation control circuit 230.

When the propagation time control signal SIG is set to the L level, transmission gate 213 in delay control unit 210 turns off, and transmission gate 211 turns on. Similarly, transmission gate 223 in delay control unit 220 turns off and transmission gate 221 turns on. Therefore, as the control signal ZRDH0 is transmitted from node #1 through transmission gate 211 to node #1*a*, it is transmitted faster from node #1 to #1*a* by the time saved by not passing through delay circuit 212.

Similarly, as the control signal ZRDL0 is also transmitted from node #2 through transmission gate 221 to node #2*a*, it is transmitted faster from node #2 to #2*a* by the time saved by not passing through delay circuit 222.

At time point t7, to output the data signal DQ at the L level as the second data in the burst read operation from data output circuit 240, control signal ZRDH0 at the H level and control signal ZRDL0 at the L level are output from output control circuit 250.

The control signal ZRDH0 at the H level is passed through transmission gate 211 to be the control signal ZRDH at the H level. The control signal ZRDL0 at the L level is passed through transmission gate 221 to be the control signal ZRDL at the L level. Therefore, data output circuit 240 outputs the data signal DQ at the L level at time point t8. Namely, the time period T2 from time point t7 to time point t8 represents the time period necessary to output the second and the following data from data output circuit 240. The time period T2 is also the period necessary for a signal at the H level to attain to the L level, that is, the time necessary to attain the inverted level. Thus, the time period T2/2, that is, half the time period T2, equals to the time period for the voltage level of a signal to attain from ½ Vcc to the H or L level.

At time point t9, in order to output the data signal DQ at the H level as the third data in the burst read operation from data output circuit 240, control signals ZRDH0 at the L level and ZRDL0 at the H level are output from output control circuit 250. Consequently, data output circuit 240 outputs the data signal DQ at the H level after the time period T2 from time point t9. Here, the prescribed propagation time periods set in delay circuits 212 and 222, respectively, are set to make equal the values tLZ and tAC. Accordingly, the time period from time point t9 until time point t10, that is, after the lapse of time period T2/2, is tAC. As a result, the time period in which the first data signal DQ is kept at the H level and the time period in which the second and the following data signals DQ are kept at the L or H level become equal.

As described above, in synchronous semiconductor memory device 1000 in accordance with the first embodiment, in a burst read operation, the period in which a data signal maintains a voltage level can be made constant regardless of the order of the read data signals. Accordingly, in the burst read operation, the set-up time and the hold time of the data signals output from synchronous semiconductor memory device 1000 also become constant. Thus, it becomes possible to read data signals more accurately by a data reading apparatus or the like provided outside the synchronous semiconductor memory device 1000.

As a result, even when there is a variation in electrical characteristics of data output circuits provided in mass-produced synchronous semiconductor memory devices and the set-up time and the hold time come to have some error, possibility of correct data reading by a data reading apparatus becomes higher. Therefore, the number of products that would have been regarded defective decreases, and production yield can be improved.

Modification of the First Embodiment

Generally, there is a variation in electrical characteristics of devices among mass-produced synchronous semiconductor memory devices. Therefore, sometimes the signal propagation time of delay circuit 212 and the signal propagation time of delay circuit 222 for adjusting tLZ in data output control circuit 200 are not the same. In the following, a configuration for adjusting propagation time of delay circuits will be described.

Figure 6:
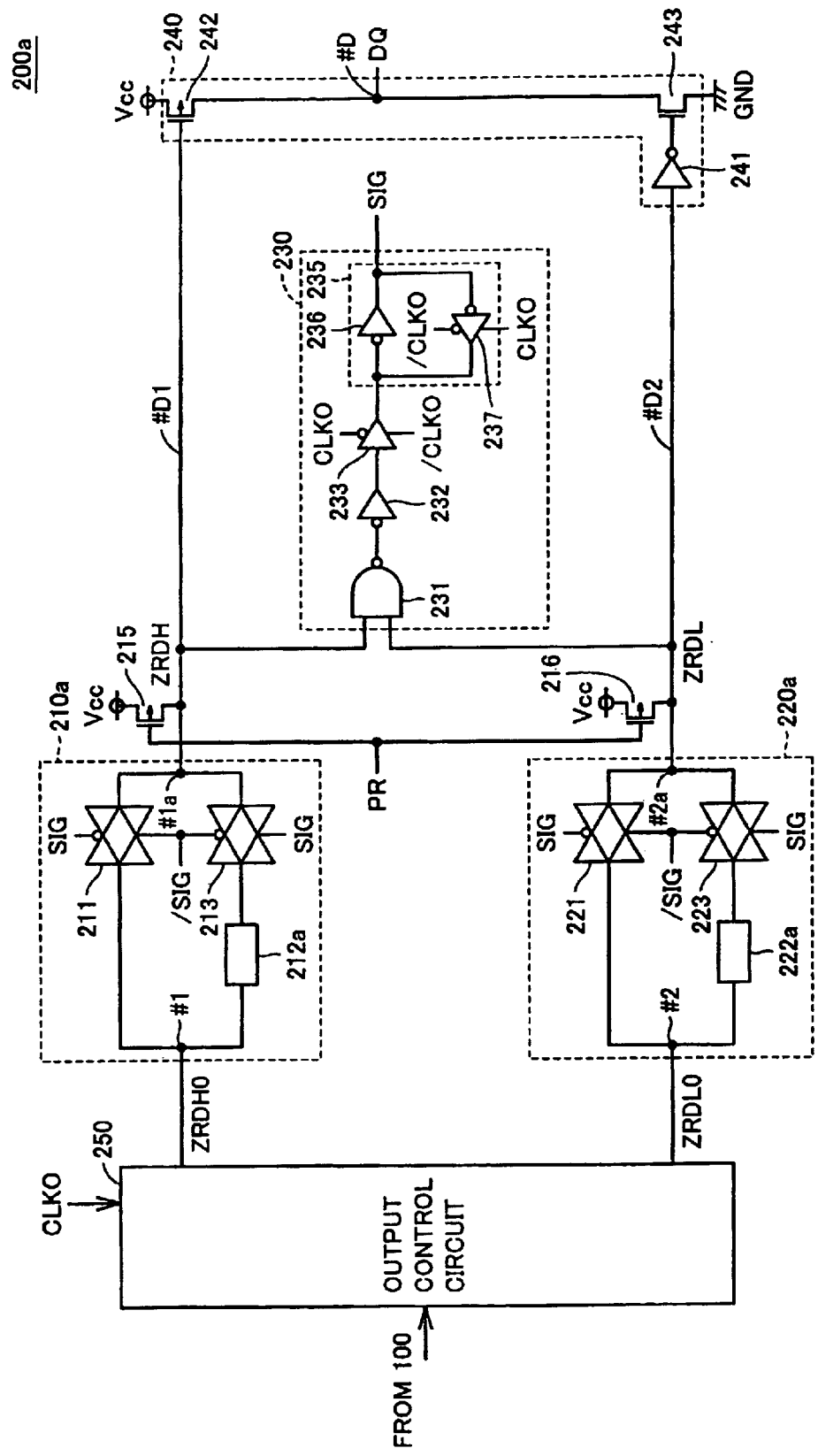
FIG. 6 is a circuit diagram representing a configuration of a data output control circuit provided inside an input/output buffer of a synchronous semiconductor memory device in accordance with a modification of the first embodiment.

Referring to FIG. 6, a data output control circuit 200a differs from data output control circuit 200 in accordance with the first embodiment shown in FIG. 3 in that a delay control unit 210a is provided in place of delay control unit 210, and that a delay control unit 220a is provided in place of delay control unit 220. Other configurations and functions are the same as those of data output control circuit 200, and therefore, detailed description will not be repeated.

Delay control unit 210a differs from delay control unit 210 in that a delay circuit 212a is provided in place of delay circuit 212. Other configurations and functions are the same as those of delay control unit 210, and therefore, detailed description will not be repeated.

Delay control unit 220a differs from delay control unit 220 in that a delay circuit 222a is provided in place of delay circuit 222. Other configurations and functions are the same as those of delay control unit 220, and therefore, detailed description will not be repeated.

Next, internal configuration of delay circuit 212a having the function of adjusting the signal propagation time will be described.

Figure 7:
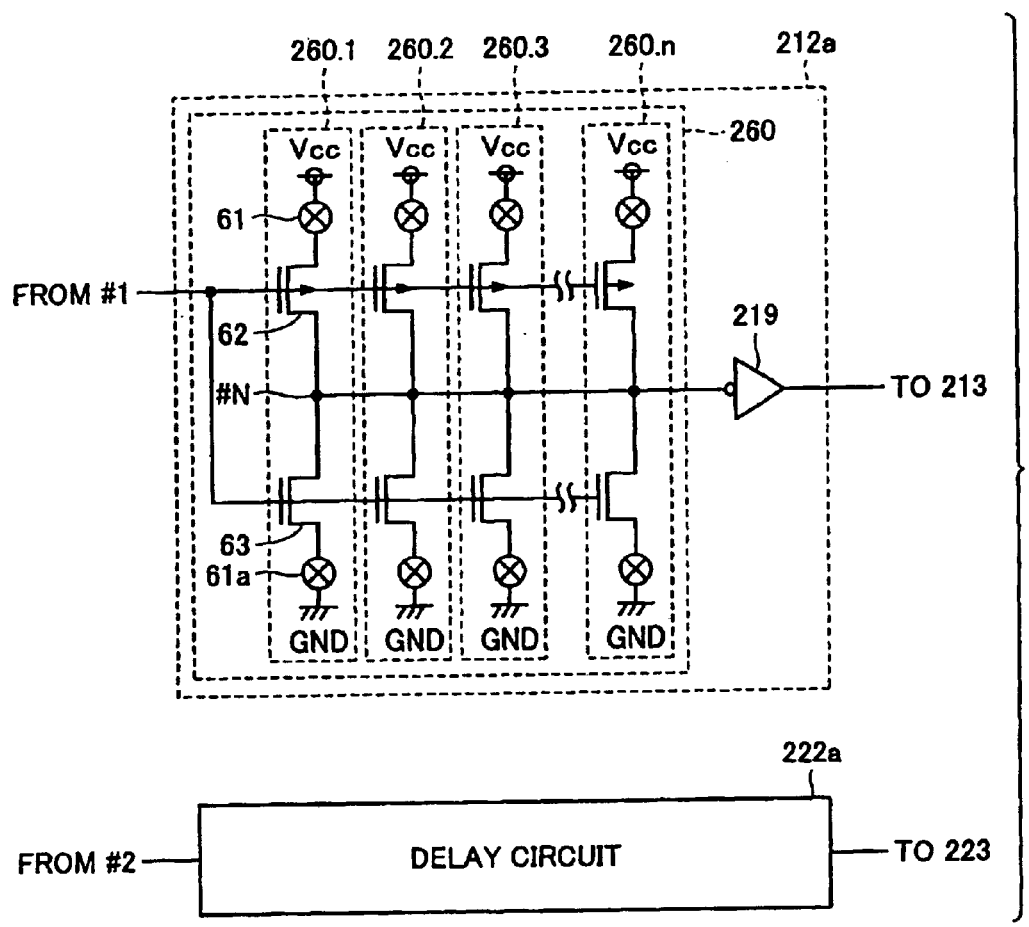
FIG. 7 is a circuit diagram representing an internal configuration of a delay circuit.

Referring to FIG. 7, delay circuit 212a has a propagation time adjusting circuit 260 and an inverter 219 connected in series.

Propagation time adjusting circuit 260 has n inverters 260.1 to 260.n connected in parallel. Inverter 260.1 has a fuse 61, a P channel MOS transistor 62, an N channel MOS transistor 63 and a fuse 61a connected in series between the power supply voltage Vcc and the ground voltage GND. Each of inverters 260.2 to 260.n has the same configuration as inverter 260.1, and therefore, detailed description will not be repeated.

A signal from node #1 is input to the gates of P channel MOS transistor 62 and N channel MOS transistor 63 in inverter 260.1. Similarly, the signal from node #1 is input to the gates of P channel MOS transistor and N channel MOS transistor of each of inverters 260.2 to 260.n. A signal output from a connection node #N between P channel MOS transistor 62 and N channel MOS transistor 63 of inverter 260.1 is output as a signal of an inverted level by inverter 219 to transmission gate 213. The signal output from the connection node between the P channel MOS transistor and the N channel MOS transistor of each of inverters 260.2 to 260.n is similarly output as a signal of the inverted level by inverter 219 to transmission gate 213.

When fuses 61 and 61a are not blown-off, inverter 260.1 outputs a signal which is level-inverted from the signal input from node #1 to inverter 219. Similarly, when two fuses in each of inverters 260.2 to 260.n are not blown-off, each of inverters 260.2 to 260.n outputs a signal which is level-inverted from the signal input from node #1 to inverter 219.

Therefore, it follows that inverters 260.1 to 260.n in propagation time adjusting circuit 260 are connected parallel to each other. Accordingly, by blowing-off the two fuses (hereinafter referred to as a fuse group) of each of inverters 260.1 to 260.n by laser beam or the like, drivability of propagation time adjusting circuit 260 can be adjusted. Specifically, when a larger number of fuse groups are blown-off, propagation time adjusting circuit 260 comes to have smaller drivability, and when a smaller number of fuse groups are blown-off, propagation time adjusting circuit 260 comes to have larger drivability. When the drivability of propagation time adjusting circuit 260 becomes smaller, the time for the signal input from node #1 to be output as a signal of the inverted level from node #N (hereinafter also referred to as a signal level transition time) becomes longer. When the drivability of propagation time adjusting circuit 260 becomes larger, the signal level transition time becomes shorter.

When the voltage level of the signal input from node #N becomes lower than or higher than a prescribed threshold value, inverter 219 outputs a signal of which level is inverted from the signal input from node #N. Specifically, inverter 219 has a function of determining whether the input signal is lower than or higher than a prescribed threshold value.

When the signal level transition time is long, the time for the signal output from node #N to be output as the signal of the inverted level by inverter 219 becomes longer. In other words, the signal propagation time of delay circuit 212a becomes longer.

When the signal level transition time is short, the time for the signal output from node #N to be output as the signal of the inverted level by inverter 219 becomes shorter. In other words, the signal propagation time of delay circuit 212a becomes shorter.

Delay circuit 222a has the same configuration and functions as delay circuit 212a, and therefore, detailed description will not be repeated.

Therefore, by the number of the fuse groups that are blown-off in delay circuit 212a or 222a, signal propagation time of delay circuit 212a or 222a can be adjusted.

As described above, in synchronous semiconductor memory device 1000 in accordance with the modification of the first embodiment, even when electrical characteristics vary at the time of mass production and it is found after product test that tLZ is out of the designed range, it is possible to adjust tLZ to be within the designed range by adjusting the signal propagation time of delay circuit 212a or 222a. Therefore, production yield can be improved.

Though a configuration in which the synchronous semiconductor memory device is represented by a DDR-SDRAM has been described in the first embodiment and in the modification thereof, application of the present invention is not limited to the field in which the synchronous semiconductor memory device is the DDR-SDRAM. When the synchronous semiconductor memory device is a memory of other specification (for example, an SDRAM), data output timing in a burst read operation can be adjusted by applying data output control circuit 200 or 200a to the data input/output circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with a clock signal, comprising:
    a memory cell array having a plurality of memory cells arranged;
    an output control circuit burst-reading a plurality of read data from said memory cell array, and sequentially generating a plurality of read instructions indicating levels of said plurality of read data respectively, in synchronization with said clock signal;
    a data output circuit outputting data in response to each of the sequentially generated said plurality of read instructions;
    a transmission control unit provided between said output control circuit and said data output circuit and transmitting each of said plurality of read instructions generated by said output control circuit to said data output circuit; and
    a signal propagation control circuit determining whether each of said plurality of read instructions sequentially generated by said output control circuit corresponds to a first one or a second or following one of said plurality of read data; wherein
    said transmission control unit transmits, in accordance with a result of determination by said signal propagation control circuit, said read instruction corresponding to said first one of said plurality of read data with a first transmission time to said data output circuit, and transmits said read instruction corresponding to said second or following one of said plurality of read data with a second transmission time being different from said first transmission time to said data output circuit.

2. The synchronous semiconductor memory device according to claim 1, wherein
    said first transmission time is longer than said second transmission time.

3. The synchronous semiconductor memory device according to claim 1, further comprising
    a voltage setting circuit precharging each of first and second nodes electrically connected to said data output circuit to a prescribed voltage before said burst-reading, and separating each of said first and second nodes from said prescribed voltage after a start of said burst-reading; wherein
    each of said plurality of read instructions includes a first control signal and a second control signal set to complementary levels dependent on the level of the corresponding read data;
    said transmission control unit transmits said first control signal and said second control signal generated by said output control circuit to said first node and said second node, respectively, with one of said first transmission time and said second transmission time, dependent on said result of determination by said signal propagation control circuit; and
    said signal propagation control circuit includes a determining unit determining, based on voltage levels of said first node and said second node, whether said first control signal and said second control signal generated by said output control circuit correspond to said first one or said second or following one of said plurality of read data.

4. The synchronous semiconductor memory device according to claim 3, wherein
    said determining unit has
    a logic circuit outputting a determination signal in accordance with a result of logical operation between the voltage level of said first node and the voltage level of said second node, and
    a transmission circuit transmitting said determination signal from said logic circuit to said transmission control unit, during a period of time starting from generation of said first control signal and said second control signal by said output control circuit up to a next generation of said first control signal and said second control signal; and wherein
    said transmission control unit switches said first transmission time and said second transmission time in accordance with said determination signal from said transmission circuit.

5. The synchronous semiconductor memory device according to claim 1, wherein
    said transmission control unit has
    a delay circuit for providing a delay time corresponding to difference between said first transmission time and said second transmission time, and
    a path switch transmitting said read instruction corresponding to said first one of said plurality of read data to said data output circuit through said delay circuit and transmitting said read instruction corresponding to said second or following one of said plurality of read data to said data output circuit bypassing said delay circuit, dependent on said result of determination by said signal propagation control circuit; and wherein said delay time of said delay circuit is adjustable in a non-volatile manner by an input from outside of said delay circuit.

6. The synchronous semiconductor memory device according to claim 5, wherein said delay circuit has at least one propagation time adjusting circuit formed of a plurality of CMOS inverters each having a prescribed drivability and connected in parallel with each other, said plurality of CMOS inverters connected in parallel each being disconnected in accordance with said input.

* * * * *